United States Patent
Kumar et al.

(10) Patent No.: US 8,004,319 B2
(45) Date of Patent: Aug. 23, 2011

(54) PROGRAMMABLE CLOCK DIVIDER

(75) Inventors: Bhoodev Kumar, Austin, TX (US); Bart J. Martinec, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 75 days.

(21) Appl. No.: 12/627,276

(22) Filed: Nov. 30, 2009

(65) Prior Publication Data

US 2011/0128051 A1 Jun. 2, 2011

(51) Int. Cl.
*H03K 21/00* (2006.01)
(52) U.S. Cl. ............... 327/115; 327/117; 377/47
(58) Field of Classification Search .......... 327/113–115, 327/117, 118; 377/47, 48
See application file for complete search history.

(56) References Cited

U.S. PATENT DOCUMENTS

| | | | |
|---|---|---|---|
| 5,524,035 A * | 6/1996 | Casal et al. ............ | 377/47 |
| 6,278,307 B1 * | 8/2001 | El-Kik ............... | 327/175 |
| 6,667,638 B1 * | 12/2003 | Kramer et al. ......... | 327/115 |
| 6,861,881 B1 * | 3/2005 | Neravetla et al. ....... | 327/115 |
| 6,998,882 B1 * | 2/2006 | Chung ............... | 327/115 |
| 7,042,257 B2 | 5/2006 | Wang | |
| 7,049,864 B2 | 5/2006 | Kelklar et al. | |
| 7,358,782 B2 * | 4/2008 | Khanoyan et al. ...... | 327/117 |
| 2005/0280449 A1 | 12/2005 | Kelkar et al. | |

FOREIGN PATENT DOCUMENTS

EP 1 612 942 A1 1/2006

* cited by examiner

*Primary Examiner* — Lincoln Donovan
*Assistant Examiner* — Patrick O'Neill
(74) *Attorney, Agent, or Firm* — Yudell Isidore Ng Russell PLLC

(57) ABSTRACT

In one or more embodiments, a programmable clock divider (PCD) can receive an input clock signal and a programmable number, and the PCD can produce a divided clock signal based on the programmable number. First and second circuits can compare first and second numbers, respectively, with a count value from a counter to generate first and second signals, respectively. A multiplexer can receive the first and second signals at inputs and can receive the clock signal at a selection input. The multiplexer can output an output signal, as a divided clock signal, based on the clock signal, the first signal, and the second signal, where the output signal transitions from a first value to a second value on at least one of a first edge of the first clock signal to output the first signal and a second edge of the first clock signal to output the second signal.

20 Claims, 11 Drawing Sheets

US 8,004,319 B2

PROGRAMMABLE CLOCK DIVIDER

BACKGROUND

1. Technical Field

This disclosure relates generally to programmable clock dividers, and more specifically, to programmable clock dividers that are capable of providing a common path for a function clock and a test clock.

2. Description of the Related Art

Various integrated systems include various components and/or devices, and these various components and/or devices can operate on non-similar clock frequencies. In one example, a processing system that includes a central processing unit (CPU) or core that operates on a clock signal of a first frequency can include various other components and/or devices that operate on one or more clock signals that have frequencies differing from the first frequency. For instance, the CPU or core can operate using a clock signal of a greater frequency than other components and/or devices of the processing system. Thus, clock dividers are used to provide other components and/or devices clock signals at lesser frequencies than clock signals provided to the CPU or core. Additionally, in some cases, using clock dividers to provide other components and/or devices clock signals at lesser frequencies than the CPU or core can introduce a phase shift or clock skew in rising edges of clock signal produces by the clock dividers.

BRIEF DESCRIPTION OF THE DRAWINGS

The present disclosure is illustrated by way of example and is not limited by the accompanying figures. Elements in the figures are illustrated for simplicity and clarity and have not necessarily been drawn to scale.

DETAILED DESCRIPTION

In one or more embodiments, a programmable clock divider (PCD) receives an input clock signal and a programmable number to produce an output clock signal of a lesser frequency than a frequency of the input clock signal. In one or more embodiments, the PCD produces one output cycle for every programmable number plus one cycles of the input clock. In a preferred embodiment, the PCD includes a common clock signal input path for both input of a function clock signal and input of a scan mode clock signal (e.g., a test mode clock signal), and by using the common clock signal path, a common insertion delay transpires whether using the function clock signal or the scan mode clock signal as the input clock signal to the PCD. In one or more embodiments, a PCD can be included in: a processor (e.g., a core), an off-part circuit, an integrated circuit, an application specific circuit (ASIC), and/or a programmable gate arrays (FPGA), among others.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Figure 1:
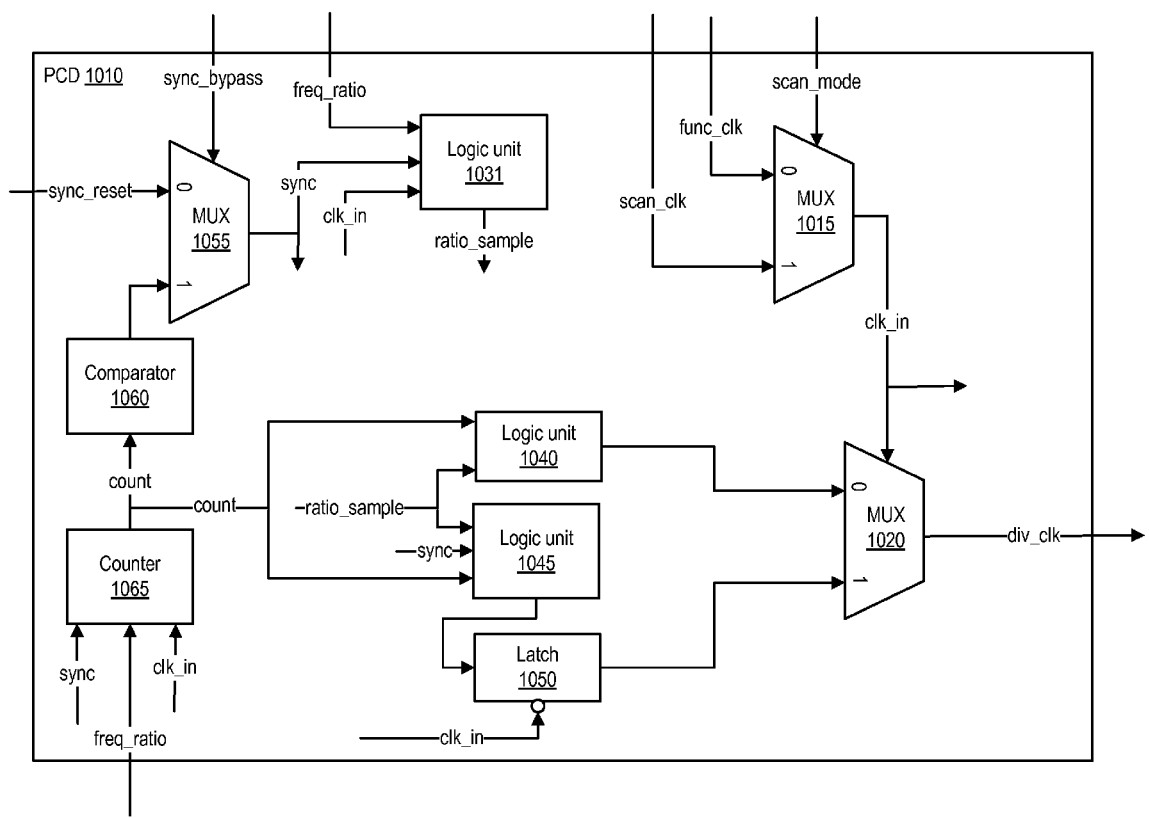
FIG. 1 provides a block diagram of a programmable clock divider, according to one or more embodiments.

With reference now to FIG. 1, there is shown a block diagram of a programmable clock divider, according to one or more embodiments. As shown, a PCD 1010 includes a MUX 1015 coupled to a MUX 1020 that produces a divided clock output signal (div_clk) of PCD 1010 based on a selection input from MUX 1015 and inputs from a logic unit 1040 and a latch 1050. MUX 1015 receives a function clock signal (e.g., a system clock signal, a clock signal from another PCD, etc.), a scan clock signal (scan_clk) (e.g., a clock for testing purposes, a test mode clock signal, etc.), and a scan mode signal (scan_mode) usable to produce an output (clk_in) from either the function clock signal (func_clk) (e.g., a system clock) and the scan clock signal based on the scan mode signal. In one or more embodiments, as illustrated, a common clock signal input path for input of the function clock signal and input of the scan mode clock signal is implemented using MUX 1015 and MUX 1020 as arranged, thereby producing a common or same insertion delay whether using the function clock signal or the scan mode clock signal as the input clock signal to PCD 1010.

In one or more embodiments, latch 1050 receives, as input, a signal from a logic unit 1045 and provides an output signal based on an inversion of clk_in. Each of logic units 1040 and 1045 receives, as input, a signal from a counter 1065, where the signal from counter 1065 indicates a count of counter 1065. Each of logic units 1040 and 1045 receives, as input, a ratio sample signal (ratio_sample), and logic unit 1045 receives, as input, a synchronization signal (sync) usable to set the programmable number (freq_ratio), e.g., an initial programmable number or to set another or new programmable number. The synchronization signal is provided by a MUX 1055, where MUX 1055 receives, as inputs, a synchronization reset signal (sync_reset), a signal from a comparator 1060, and a synchronization bypass signal (sync_bypass) to select between the synchronization reset signal and the signal from comparator 1060 to produce the synchronization signal.

In one or more embodiments, comparator 1060 receives a signal from counter 1065 that indicates the count of counter 1065, and comparator 1060 produces a signal indicating a true value if the count is zero and produces a signal indicating a false value if the value is not zero. In one or more embodiments, a signal can include a high value that can represent a logical "1" or "true" value, and a signal can include a low value that can represent a logical "0" or "false" value. For example, the high value can correspond to a first voltage level and the low value can correspond to a different second voltage level. For instance, the first voltage level can be a higher voltage level than the second voltage level. In one or more embodiments, a circuit receiving, transmitting, and/or using one more signals that include the high value and the low value can differentiate between the high value and the low value such that the high value and the low value corresponds respectively to logical "1" and logical "0" values.

In one or more embodiments, counter 1065 and logic unit 1031 receive the synchronization signal, the programmable number (freq_ratio), and clk_in. Counter 1065 loads the value of the counter with the programmable number (freq_ratio) when the synchronization signal is the high value and decrements the value of counter 1065 on a rising edged of clk_in. Logic unit 1031 calculates a ratio_sample by adding one to the programmable number and provides the ratio_sample to logic units 1040 and 1045.

In one or more embodiments, logic units 1040 and 1045 produce the high value for a first half of ratio_sample cycles of clk_in and produce the low value for a second half of ratio_sample cycles of clk_in. When ratio_sample is an even number, logic unit 1045 produces a value that is one cycle of clk_in ahead of logic unit 1040. In a preferred embodiment, a latch 1050 receives the value from logic unit 1045 and delays outputting the value by one-half cycle of clk_in by using an inverted signal of clk_in. In this fashion, MUX 1020 selects the signal from latch 1050 and produces div_clk that transitions from the high value to the low value on a rising edge an Nth cycle of clk_in, where N is a number that is one-half of ratio_sample.

Figure 2:
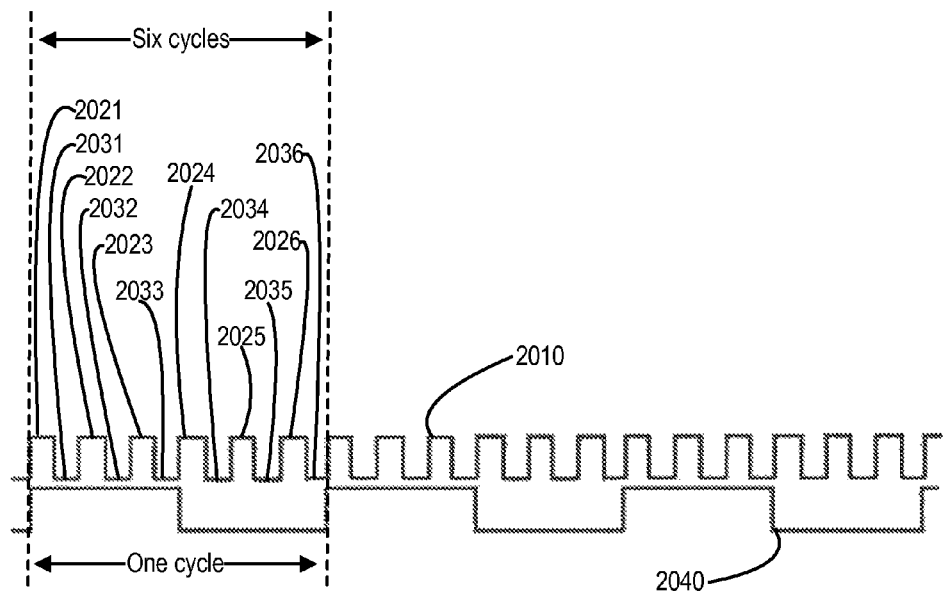
FIG. 2 provides exemplary waveforms of a clock signal and a divided clock signal, according to one or more embodiments.

This is demonstrated in one example that is illustrated in FIG. 2. In this example, the programmable number (freq_ratio) is five; ratio_sample is six; clk_in is represented by waveform 2010; and div_clk is represented by waveform 2040. As illustrated, one cycle of div_clk (waveform 2040) occurs during the programmable number plus one (e.g., six) cycles of an input clock of PCD 1010, and div_clk (waveform 2040) transitions from the high value to the low value on a rising edge an Nth (e.g., third) cycle of clk_in (waveform 2010), where N (e.g., three) is a number that is one-half of ratio_sample (e.g., six). As also illustrated, the input clock of PCD 1010 (waveform 2010) includes a first set of sequential high values 2021-2023, a first set of sequential low values 2031-2033, a second set of sequential high values 2024-2026, and a second set of sequential low values 2034-2036 of the input clock. In one or more embodiments, output of PCD 1010 (waveform 2040) is the high value for the first set of sequential high values 2021-2023 and the first set of sequential low values 2031-2033 of the input clock, and output of PCD 1010 (waveform 2040) is the low value for the second set of sequential high values 2024-2026 and the second set of sequential low values 2034-2036 of the input clock.

When ratio_sample is an odd number, logic units 1040 and 1045 produce same values. In a preferred embodiment, MUX 1020 selects the signal from logic unit 1040 and produces div_clk that transitions from the high value to the low value on a falling edge an Nth cycle of clk_in, where N is a number that is one-half of ratio_sample disregarding any remainder (e.g., using integer division disregarding any remainder). In this fashion, div_clk that transitions from the high value to the low value one-half way through the Nth cycle of clk_in.

Figure 3:
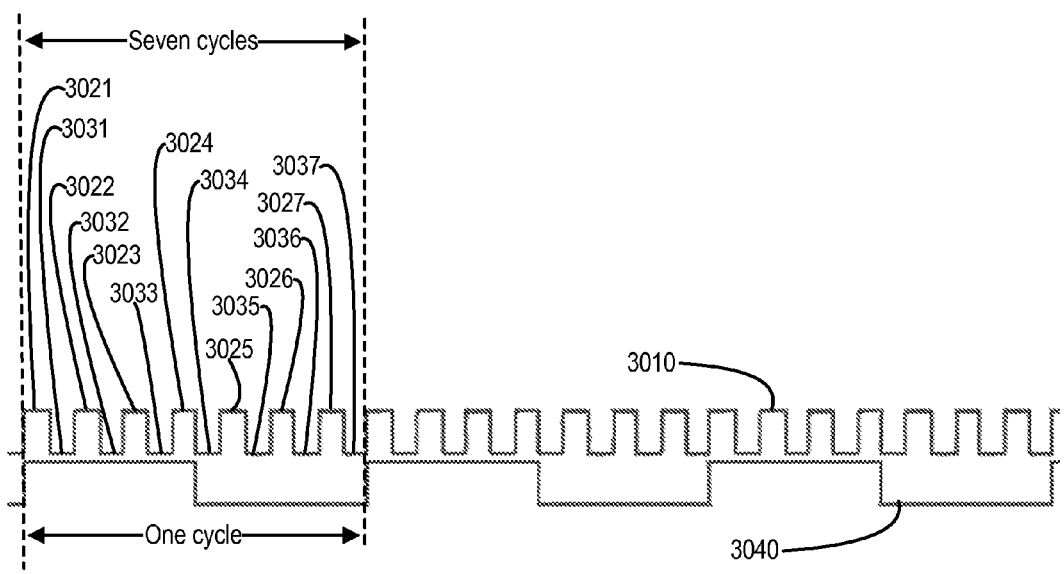
FIG. 3 provides exemplary waveforms of a clock signal and a divided clock signal, according to one or more embodiments.

This is demonstrated in one example that is illustrated in FIG. 3. In this example, the programmable number (freq_ratio) is six; ratio_sample is, therefore, seven; clk_in is represented by waveform 3010; and div_clk is represented by waveform 3040. As illustrated, one cycle of div_clk (waveform 3040) occurs during the programmable number plus one (e.g., seven) cycles of an input clock of PCD 1010, and div_clk (waveform 3040) transitions from the high value to the low value on a falling edge an Nth (e.g., third) cycle of clk_in (waveform 3010), where N (e.g., three) is a number that is one-half of ratio_sample (e.g., seven) disregarding any remainder (e.g., one). As also illustrated, the input clock of PCD 1010 (waveform 3010) includes a first sequential set of sequential high values 3021-3024, a first set of sequential low values 3031-3033, a second set of sequential high values 3025-3027, and a second set of sequential low values 2034-2037 of the input clock. In one or more embodiments, output of PCD 1010 (waveform 3040) is the high value for the first set of sequential high values 3021-3024 and the first set of sequential low values 3031-3033 of the input clock, and output of PCD 1010 (waveform 3040) is the low value for the second set of sequential high values 3025-3027 and the second set of sequential low values 3034-3037 of the input clock.

Figure 4:
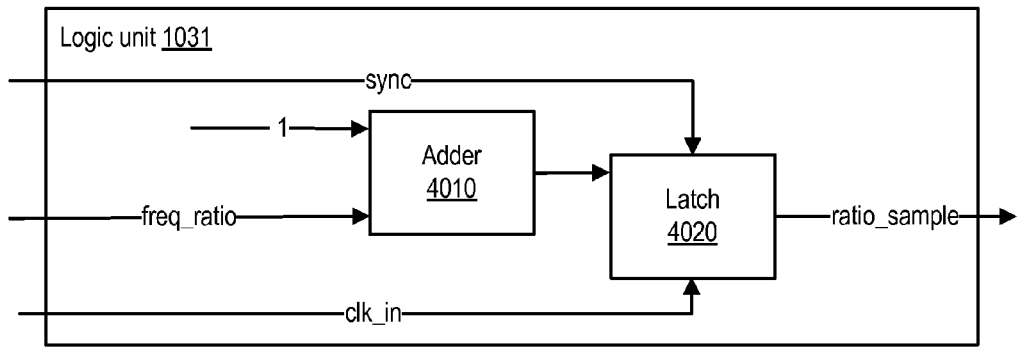
FIG. 4 provides a block diagram of a logic unit, according to one or more embodiments.

Turning now to FIG. 4, a block diagram of logic unit 1031 is illustrated, according to one or more embodiments. As shown, logic unit 1031 includes an adder 4010 and a latch 4020. Adder 4010 provides an addition of the programmable number (freq_ratio) and one to latch 4020. In a preferred embodiment, latch 4020 is a programmable latch that accepts input when the synchronization signal (sync) is the high value and upon a rising edge of clk_in. Latch 4020 provides the addition of the programmable number (freq_ratio) and one as ratio_sample.

Figure 5:
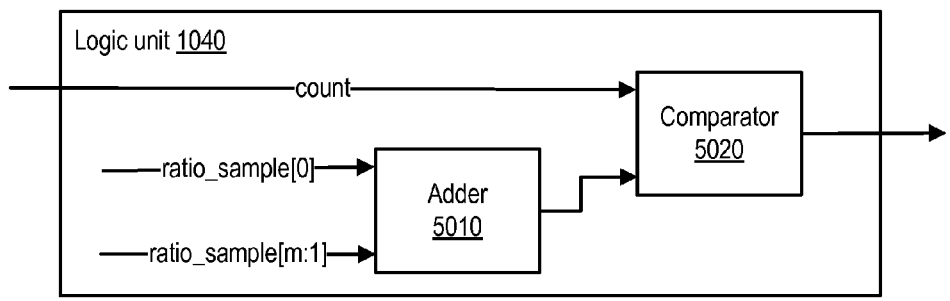
FIG. 5 provides a block diagram of a logic unit, according to one or more embodiments.

Turning now to FIG. 5, a block diagram of logic unit 1040 is illustrated, according to one or more embodiments. As shown, logic unit 1040 includes an adder 5010 and a comparator 5020. Adder 5010 provides an addition of a least significant bit of ratio_sample (ratio_sample[0]) and ratio_sample truncated by omitting the least significant bit of ratio_sample (ratio_sample[m:1], where m is a number of bits of ratio_sample). In one or more embodiments, ratio_sample truncated by omitting the least significant bit of ratio_sample can be produced by dividing ratio_sample by two or by shifting bits of ratio_sample by one bit towards a least significant bit of ratio_sample. In a preferred embodiment, comparator 5020 compares the addition performed by adder 5010 and the count from counter 1065 and produces the high value if the count from counter 1065 is greater than or equal to the addition performed by adder 5010 or the low value otherwise. In one or more embodiments, logic unit 1040 can be implemented using a hardware description language statement, such as: "count>=ratio_sample[m:1]+ratio_sample[0]". It is noted that adder 5010 produces an odd number if ratio_sample is an odd number and produces an even number if ratio_sample is an even number. In one or more embodiments, a determination of whether or not ratio_sample is an odd or even number can be determined by a determination of whether of not a number produced by adder 5010 is an odd or even number, and vice versa.

Figure 6:
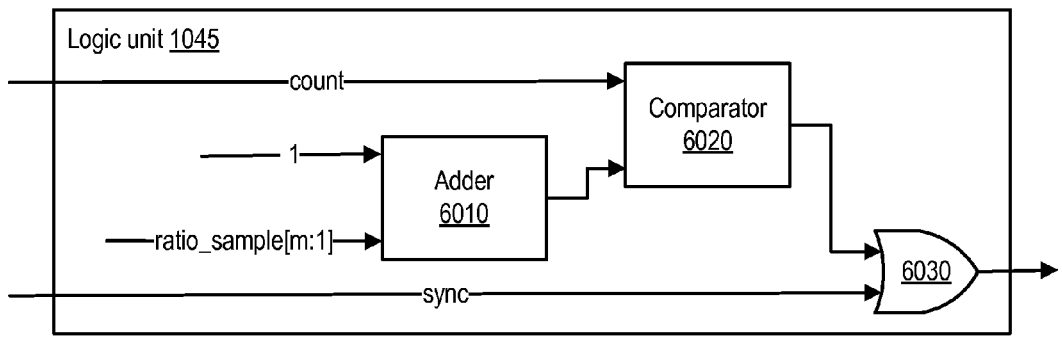
FIG. 6 provides a block diagram of a logic unit, according to one or more embodiments.

Turning now to FIG. 6, a block diagram of logic unit 1045 is illustrated, according to one or more embodiments. As shown, logic unit 1045 includes an adder 6010, a comparator 6020, and an OR gate 6030. Adder 6010 provides an addition of one and ratio_sample truncated by omitting the least significant bit of ratio_sample (ratio_sample[m:1], where m is a number of bits of ratio_sample). In one or more embodiments, ratio_sample truncated by omitting the least significant bit of ratio_sample can be produced by dividing ratio_sample by two or by shifting bits of ratio_sample by one bit towards a least significant bit of ratio_sample. In a preferred embodiment, comparator 6020 compares the addition performed by adder 6010 and the count from counter 1065 and produces the high value if the count from counter 1065 is greater than or equal to the addition performed by adder 6010 or the low value otherwise. OR gate 6030 receives the value from comparator 6020 and the value of the synchronization signal, and produces a value based on those values. In one or more embodiments, logic unit 1045 can be implemented using a hardware description language statement, such as: "(count>=ratio_sample[m:1]+1)|sync", where the symbol "|" represents a bit-wise OR. In one or more embodiments, logic unit 1045 provides the high value to MUX 1020 when PCD 1010 starts a new cycle of the divided clock output signal (div_clk) of PCD 1010. When PCD 1010 starts a new cycle, the synchronization signal (sync) is the high value, and logic unit 1045 provides the high value to MUX 1020 via OR gate 6030.

Figure 7:
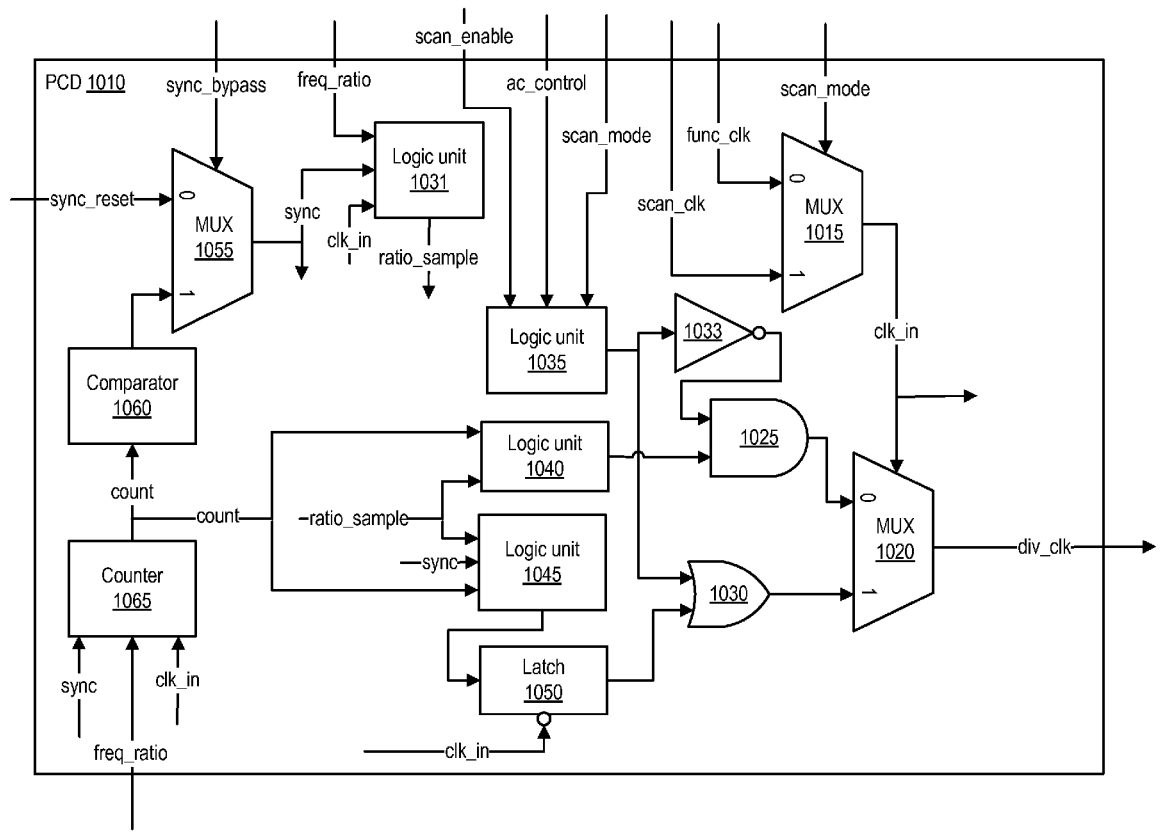
FIG. 7 provides a block diagram of a programmable clock divider that includes additional units usable in performing one or more additional testing functionalities, according to one or more embodiments.

Turning now to FIG. 7, a block diagram of a programmable clock divider that includes additional units usable in performing an additional testing functionality is illustrated, according to one or more embodiments. In one or more embodiments, the additional testing functionality can include outputting scan_clk as the output signal (div_clk) of PCD 1010 without any division of the scan clock signal. As shown, PCD 1010 can include elements described above with reference to FIG. 1. As illustrated, PCD 1010 includes an AND gate 1025 that interposes logic unit 1040 and MUX 1020 and an OR gate 1030 that interposes latch 1050 and MUX 1020. PCD 1010 also includes an inverter 1033 that provides signals to AND gate 1025 and a logic unit 1035 that provides signals to inverter 1033 and OR gate 1030. AND gate 1025 provides signals to MUX 1020 based on signals received from inverter 1033 and logic unit 1040, and OR gate 1030 provides signals to MUX 1020 based on signals received from logic unit 1035 and latch 1050. Logic unit 1035 receives, as input, scan_mode, an alternating current control signal (ac_control), and a scan enable signal (scan_enable). In one or more embodiments, logic unit 1035, inverter 1033, AND gate 1025, OR gate 1030, and MUX 1020 can be used to override a clock division function, provided and/or implemented by other elements of PCD 1010, based on inputs scan_mode, ac_control, and scan_enable, and during the override, the output signal (div_clk) of PCD 1010 corresponds to the scan clock signal (e.g., a clock for testing purposes) or scan_clk without any division of the scan clock signal.

Figure 8:
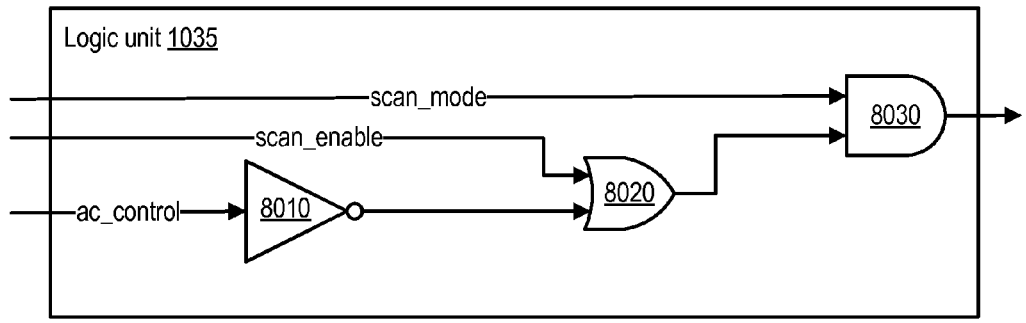
FIG. 8 provides a block diagram of a logic unit, according to one or more embodiments.

Turning now to FIG. 8, a block diagram of logic unit 1035 is illustrated, according to one or more embodiments. As shown, logic unit 1035 includes an inverter 8010, an OR gate 8020, and an AND gate 8030. Inverter 8010 receives ac_control, and provides a signal to OR gate 8020 based on an inversion of ac_control. OR gate receives, as inputs, the inversion of ac_control from inverter 8010 and scan_enable, and provides a signal to AND gate 8030 based on the inversion of ac_control and scan_enable. AND gate 8030 receives, as inputs, the signal from OR gate 8020 and scan_mode, and provides, as output for logic unit 1035, a signal based on the signal from OR gate 8020 and scan_mode.

Figure 9:
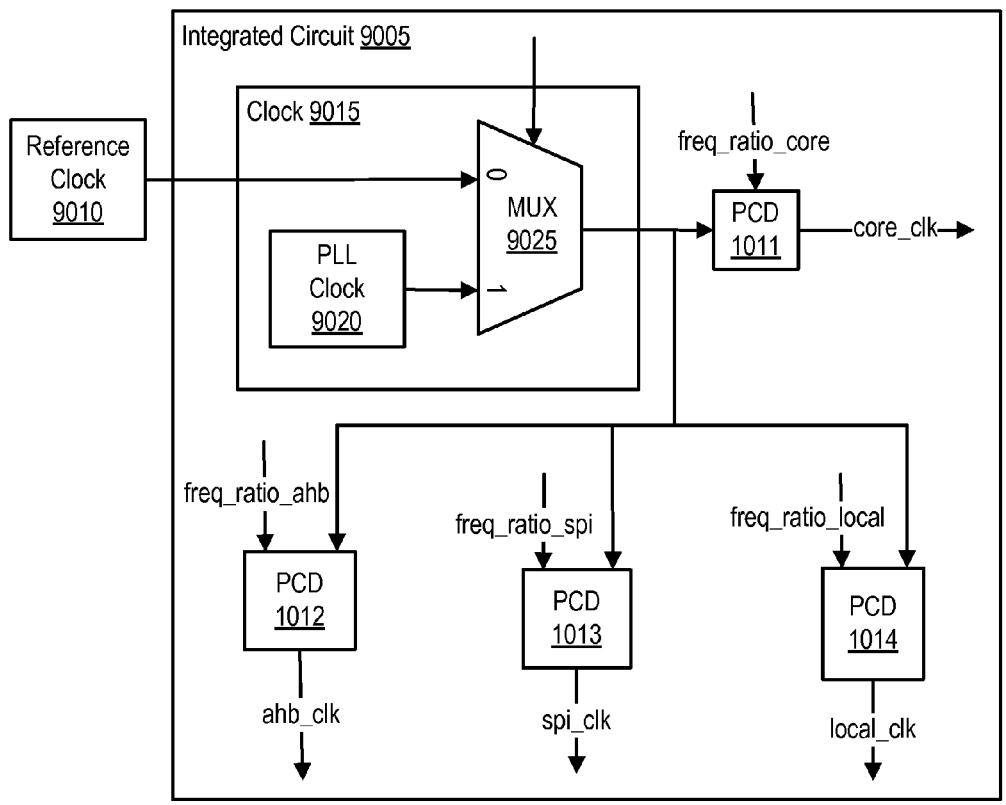
FIG. 9 provides a block diagram of a clock and programmable clock dividers, according to one or more embodiments.

Turning now to FIG. 9, a block diagram of a clock and programmable clock dividers is illustrated, according to one or more embodiments. In one or more embodiments, a PCD can provide a divided clock signal to a core operable to execute instructions of an instruction set architecture, an inter-integrated circuit bus, a serial peripheral interface bus, an advanced high-performance bus, a universal serial bus, a microwire bus, an IEEE 1394 bus, a small computer system interface bus, an ATA bus, and/or a serial attached small computer system interface bus, among others. As illustrated, clock 9015 includes a MUX 9025 and a phased locked loop (PLL) clock 9020. A reference clock 9010 and PLL clock 9020 can be coupled to inputs of MUX 9025, and an output of MUX 9025 can be coupled to PCDs 1011-1014. In one or more embodiments, PCD 1011 receives a programmable number freq_ratio_core that can be used by PCD 1011 to divide a clock signal from clock 9015 and provide a clock signal (core_clk) to one or more cores and/or other devices. As shown, PCDs 1012-1014 receives respective programmable numbers freq_ratio_ahb, freq_ratio_spi, and freq_ratio_local. PCDs 1011-1014 produce respective divided clock signals core_clk, ahb_clk, spi_clk, and local_clk. In one example, ahb_clk can provide a clock signal for an advanced high performance bus. In a second example, spi_clk can provide a clock signal to a SPI bus. In another example, local_clk can provide a clock signal to a local bus. In one or more embodiments, PCDs 1011-1014 include structures and/or functionalities described above with reference to PCD 1010. As illustrated, an integrated circuit 9005 can include clock 9015 and PCDs 1011-1012, according to one or more embodiments.

Figure 10:
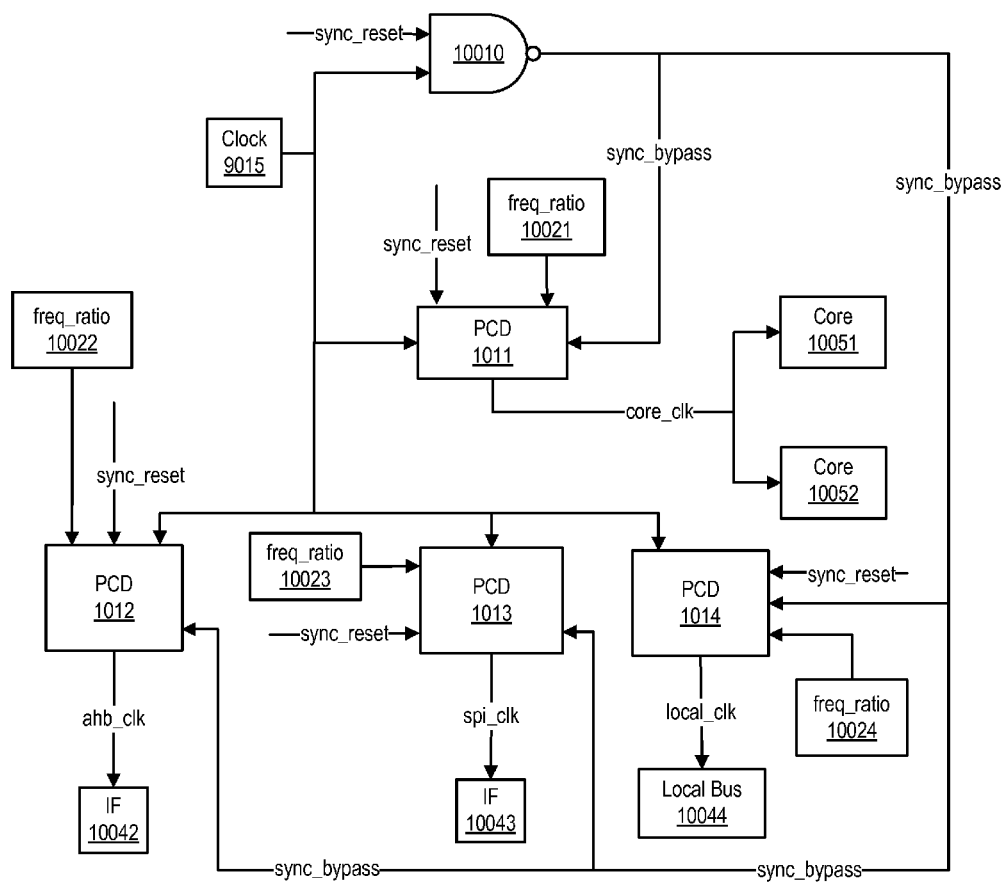
FIG. 10 provides a block diagram of a clock and programmable clock dividers, according to one or more embodiments.

Turning now to FIG. 10, a block diagram of a clock and programmable clock dividers is illustrated, according to one or more embodiments. As illustrated, clock 9015 provides a clock signal to PCDs 1011-1014 and a NAND gate 10010, and NAND gate 10010 receives the clock signal from clock 9015 and a sync_reset signal. NAND gate 10010 produces a sync_bypass signal that can be utilized to synchronize rising edges of divided clock signals of PCDs 1011-1014. For example, when sync_reset is the high value and the signal from clock 9015 is the high value, NAND gate 10010 produces the low value as the sync_bypass signal. PCDs 1011-1014 receive the sync_reset signal and the sync_bypass signal, and PCDs 1011-1014 receive respective programmable numbers 10021-10024. In one or more embodiments, each of PCDs 1011-1014 can be programmed with a respective programmable number (freq_ratio), and each divided clock signal of PCDs 1011-1014 can be synchronized. For example, each rising edge divided clock signal of PCDs 1011-1014 can be synchronized according to some metric. For instance, each rising edge of each divided clock signal of PCDs 1011-1014 can be synchronized to within sixteen percent (16%) of some time period. In another instance, each divided clock signal of PCDs 1011-1014 can be synchronized to within a phase difference of at most sixteen percent (16%) compared with any other divided clock signal.

In one or more embodiments, once PCDs 1011-1014 have been synchronized, one or more new frequency ratios can be applied to one or more of PCDs 1011-1014, and one or more new divided clock signals can be produced with each rising edge of the new one or more divided clock signals being synchronized with each of the other divided clock signals. For example, a new programmable number can be applied to PCD 1012. Once PCD 1012 has completed a number of cycles of the clock signal from clock 9015 that corresponds to its old (or current) programmable number 10022, the new programmable number is used to produce a new divided clock signal for PCD 1012. The new divided clock signal for PCD 1012 can be synchronized to the other divided clock signals. In one or more embodiments, the new divided clock signal for PCD 1012 can be synchronized to the other divided clock signals to one or more tolerances described above.

Figure 11:
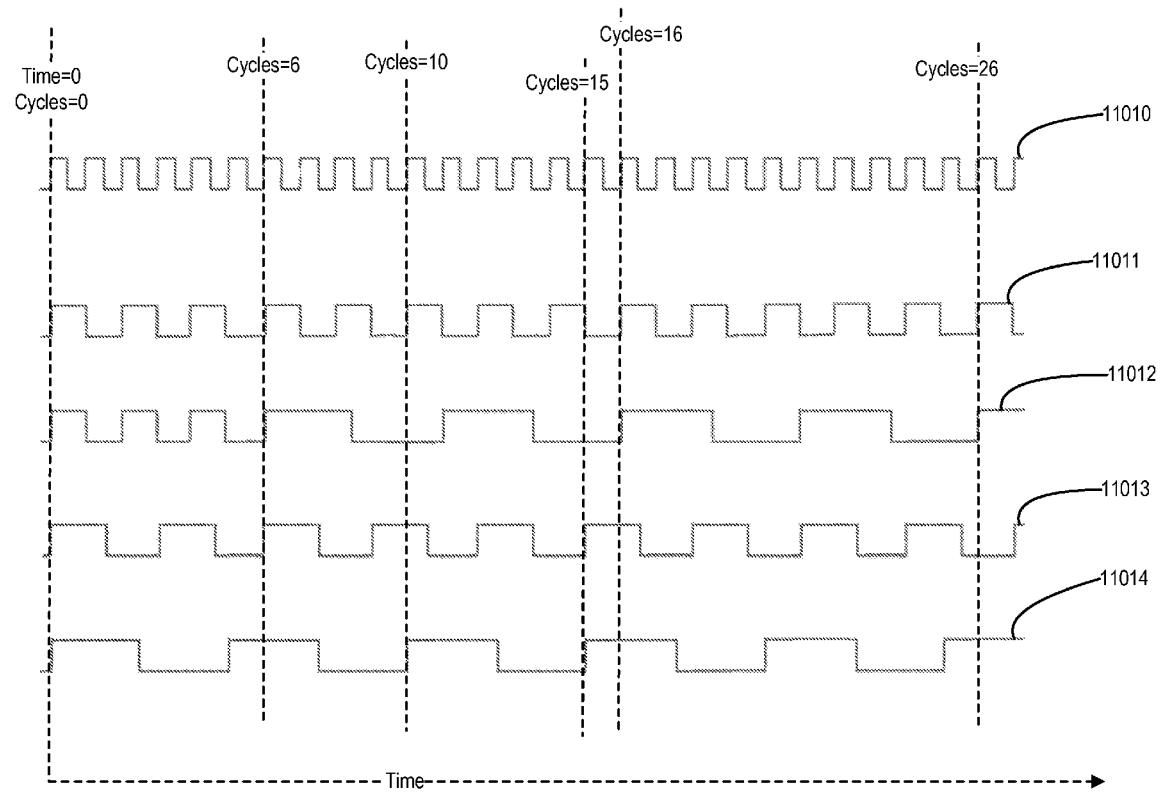
FIG. 11 illustrates exemplary waveforms, according to one or more embodiments.

Turning now to FIG. 11, exemplary waveforms are illustrated, according to one or more embodiments. In one or more example, waveforms 11011-11014 can correspond to outputs of PCDs 1011-1014, respectively, and waveform 11010 can correspond to a clock (e.g., output from clock 9015). As illustrated, rising edges of outputs of PCDs 1011-1014 can be synchronized at a time of zero (e.g., Cycles=0) with a rising edge of clock 9015. In one or more examples, programmable numbers (freq_ratios) 10021-10024 can respectively correspond to: 1, 1, 2, and 4. For instance, programmable division number (freq_ratio) 10022 can be changed to 4 when cycles of clock 9015 is 6 (Cycles=6). As illustrated, waveform 11011 cycles once for every four cycles of waveform 11010 corresponding to output of clock 9015, waveform 11013 cycles once for every six cycles of waveform 11010, and waveform 11014 cycles once for every ten cycles of waveform 11010. Waveform 11012 cycles once for every four cycles of waveform 11010 until PCD 1102 is reprogrammed, and after PCD 1102 is programmed with a new programmable number (e.g., 4) and starting on the rising edge of clock 9015 where cycles=6, waveform 11012 cycles once for every ten cycles of waveform 11010.

In one or more embodiments, rising edges of various waveforms correlate at various times and/or cycles. In one example, rising edges of waveforms 11011, 11012, and 11013 correlate at cycles=6. In a second example, rising edges of waveforms 11011 and 11014 correlate at cycles=10. In a third example, rising edges of waveforms 11013 and 1014 correlate at cycles=15. In a fourth example, rising edges of waveform 11012 (e.g., after reprogramming PCD 1012) and waveform 11011 correlate at cycles=16.

In one or more embodiments, various rising edges of waveforms 11010-11014 may not correlate precisely. For instance, each rising edge of waveforms 11010-11014 can be synchronized to within sixteen percent (16%) of some period of time. In another instance, each of waveforms 11010-11014 can be synchronized to within a phase difference of at most sixteen percent (16%) compared with any other divided clock output signal.

Figure 12A:
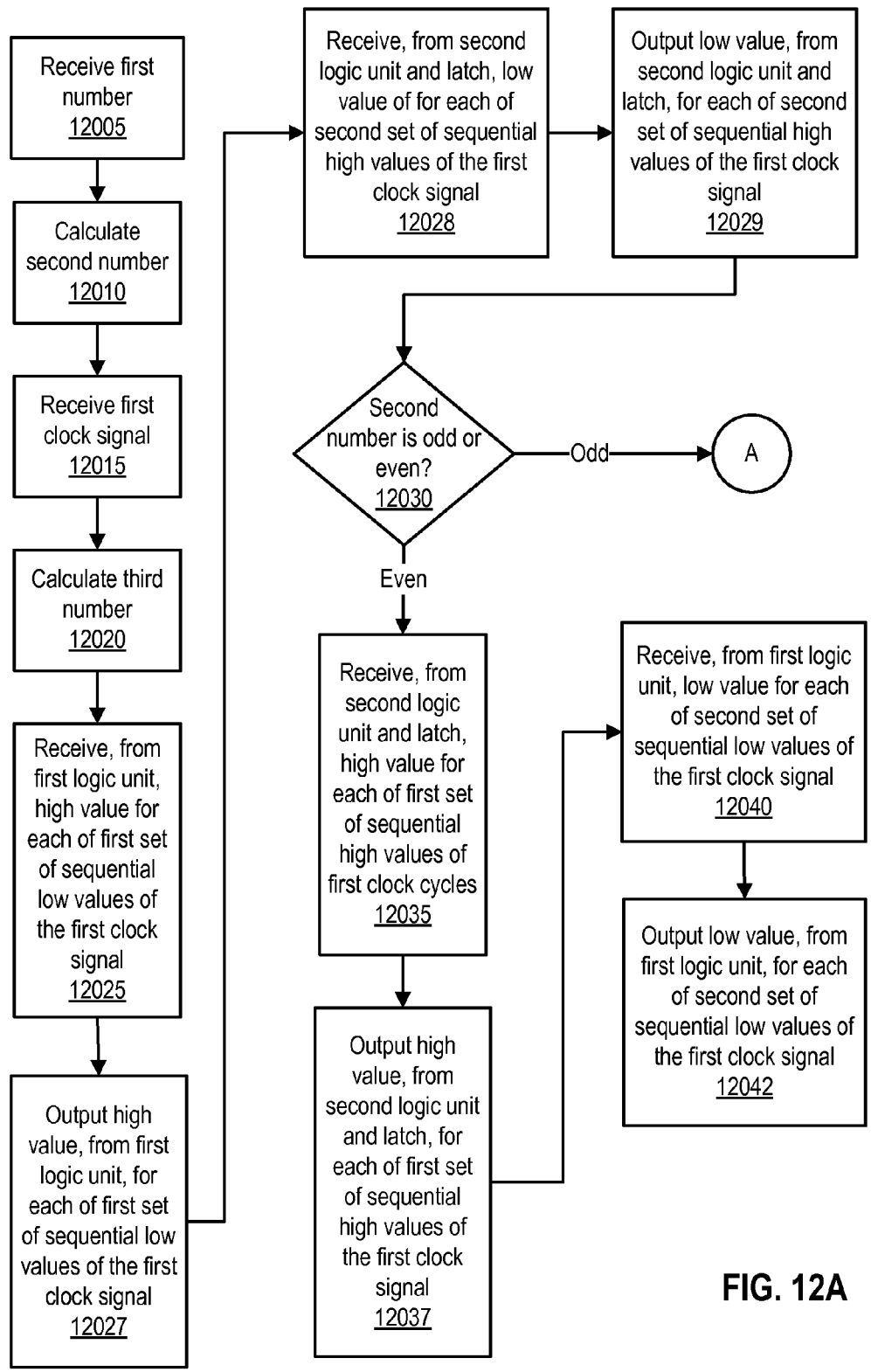
FIGS. 12A and 12B illustrate a method for producing a divided clock signal, according to one or more embodiments.
Figure 12B:
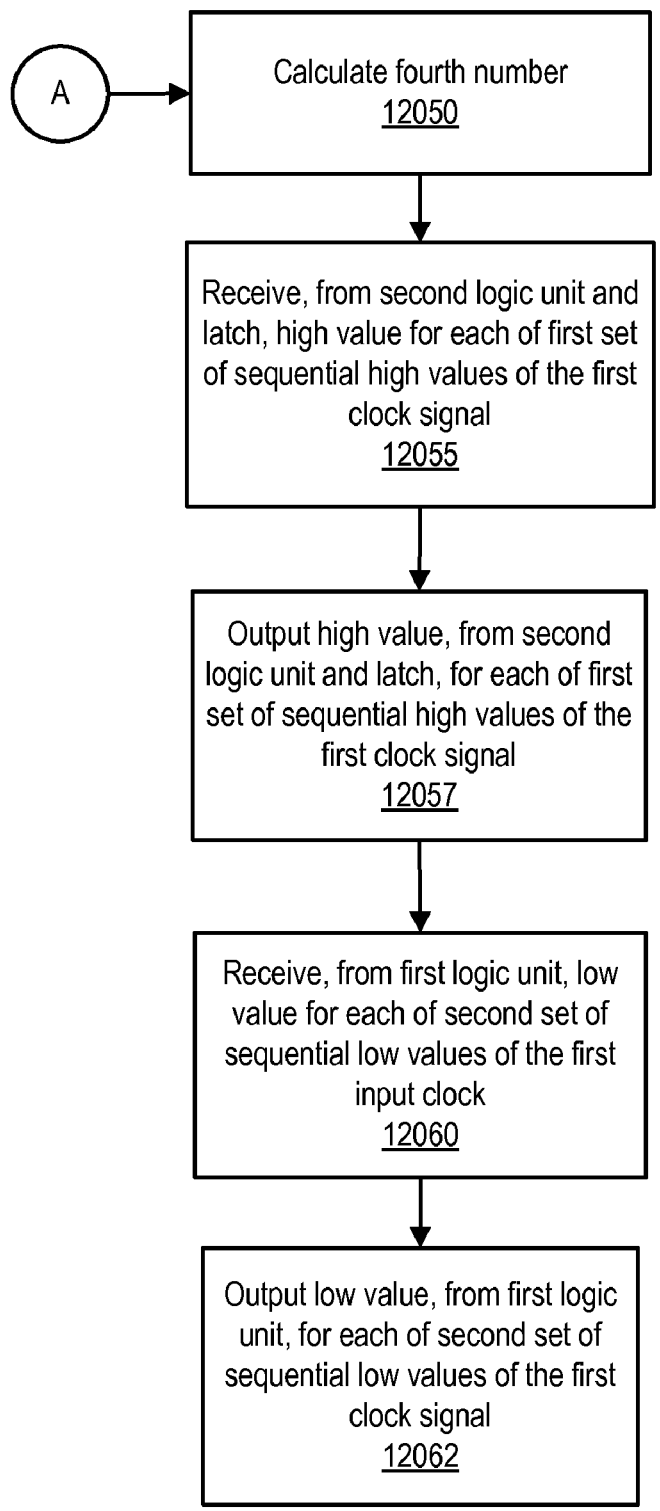

Turning now to FIGS. 12A and 12B, a method for producing a divided clock signal is illustrated, according to one or more embodiments. At 12005, a programmable number (e.g., freq_ratio) can be received as a first number. At 12010, a second number can be calculated by adding one to the first number. For example, logic unit 1031 can add one to freq_ratio, and ratio_sample can be the second number. At 12015, MUX 1020 receives a first clock signal at a selection input of MUX 1020, where the first clock signal produces a high value for a first half of a first time period of the first clock signal and a low value for a second half of the first time period. At 12020, a third number can be calculated by dividing the second number by two using integer division. In one or more embodiments, dividing the second number by two using integer division is implemented by bit shifting the second number by one bit towards the least significant bit of the second number. In one or more embodiments, dividing the second number by two using integer division is implemented by truncating the second number by omitting the least significant bit of the second number. For example, each of logic units 1040 and 1045 can truncate ratio_sample by omitting the least significant bit of ratio_sample to produce the third number.

At 12025, the high value can be received from a first logic unit for each of a first set of sequential low values of the first clock signal. For example, the first set of sequential low values of the first clock signal can exist such that a cardinality of the first set of sequential low values of the first clock signal is equal to the third number, and the high value can be received from the first logic unit for each of the first set of sequential low values of the first clock signal. In one or more embodiments, MUX 1020 receives, at a first input, the high value from logic unit 1040 for each of the first set of sequential low values of the first clock signal and output the received high value at 12027. In one example, the first number can be five, and, thus, the third number is three. As shown in FIG. 2, MUX 1020 outputs received high values from logic unit 1040 for each of a first set of sequential low values 2031-2033 of the first clock signal. In a second example, the first number can be six, and, thus, the third number is three. As shown in FIG. 3, MUX 1020 outputs received high values from logic unit 1040 for each of a first set of sequential low values 3031-3033 of the first clock signal.

At 12028, the low value can be received from a second logic unit and a latch for each of a second set of sequential high values of the first clock signal. For example, the second set of sequential high values of the first clock signal can exist such that a cardinality of the second set of sequential high values of the first clock signal is equal to the third number, and the low value can be received from the second logic unit and the latch for each of the second set of sequential high values of the first clock signal. In one or more embodiments, MUX 1020 receives, at a second input, the low value from logic unit 1045 and latch 1050 for each of the second set of sequential high values of the first clock signal and output the received low value at 12029. In one example, the first number can be five, and, thus, the third number is three. As shown in FIG. 2, MUX 1020 outputs received low values from logic unit 1045 and latch 1050 for each of a second set of sequential high values 2024-2026 of the first clock signal. In a second example, the first number can be six, and, thus, the third number is three. As shown in FIG. 3, MUX 1020 outputs received low values from logic unit 1045 and latch 1050 for each of a second set of sequential high values 3025-3027 of the first clock signal.

At 12030, it can be determined whether the second number is an even number or an odd number. In one or more embodiments, based on whether the second number is an odd number or an even number, the method can conditionally perform 12035-12042 if the second number is an even number or perform 12050-12062 if the second number is an odd number.

At 12035, the high value can be received from a second logic unit and a latch for each of a first set of sequential high values of the first clock signal. For example, the first set of sequential high values of the first clock signal can exist such that a cardinality of the first set of sequential high values of the first clock signal is equal to the third number, and the high value can be received from the second logic unit and the latch for each of the first set of sequential high values of the first clock signal. In one or more embodiments, MUX 1020 receives, at a second input, the high value from logic unit 1045 and latch 1050 for each of the first set of sequential high values of the first clock signal, and MUX 1020 output the received high values at 12037. In one example, the first number can be five, and, thus, the third number is three. As shown in FIG. 2, MUX 1020 outputs received high values from logic unit 1045 and latch 1050 for each of a first set of sequential high values 2021-2023.

At 12040, the low value can be received from the first logic unit for each of a second set of sequential low values of the first clock signal. For example, the second set of sequential low values of the first clock signal can exist such that a cardinality of the second set of sequential low values of the first clock signal is equal to the third number, and the low value can be received from the first logic unit for each of the second set of sequential low values of the first clock signal. In one or more embodiments, MUX 1020 receives, at the first input, the low value from logic unit 1040 for each of the second set of sequential low values of the first clock signal, and MUX 1020 can output the received low values at 12042. In one example, the first number can be five, and, thus, the third number is three. As shown in FIG. 2, MUX 1020 outputs received low values from logic unit 1040 for each of a second set of sequential low values 2034-2036.

At 12050, a fourth number can be calculated by adding one to the third number. At 12055, the high value can be received from the second logic unit and the latch for each of a first set of sequential high values of the first clock signal. For example, the first set of sequential high values of the first clock signal can exist such that a cardinality of the first set of high values of the first clock signal is equal to the fourth number, and the high value can be received from the second logic unit and the latch for each of the first set of sequential high values of the first clock signal. In one or more embodiments, MUX 1020 receives, at the second input, the high value from logic unit 1045 and latch 1050 for each of the first set of sequential high values of the first clock signal, and MUX 1020 can output the received high values at 12057. In one example, the first number can be six, and, thus, the fourth number is four. As shown in FIG. 3, MUX 1020 outputs received high values from logic unit 1045 and latch 1050 for each of a first set of sequential high values 3021-3024.

At 12060, the low value can be received from the first logic unit for each of a second set of sequential low values of the first clock signal. For example, the second set of sequential low values of the first clock signal can exist such that a cardinality of the second set of sequential low values of the first clock signal is equal to the fourth number, and the low value can be received from the first logic unit for each of the second set of sequential low values of the first clock signal. In one or more embodiments, MUX 1020 receives, at the first input, the low value from logic unit 1040 for each of the second set of sequential low values of the first clock signal, and MUX 1020 can output the received low values at 12062. In one example, the first number can be six, and, thus, the fourth number is four. As shown in FIG. 3, MUX 1020 outputs received low values from logic unit 1040 for each of a second set of sequential low values 3034-3037.

In one or more embodiments, a second clock signal can be used where the first clock signal is used in the method illustrated in FIGS. 12A and 12B. For example, the first clock signal can be func_clk and the second clock signal can be scan_clk as shown in FIG. 1. In one or more embodiments, MUX 1015 can provide either the first clock signal (e.g., func_clk) or the second clock signal (e.g., scan_clk) to the selection input of MUX 1020 based on a signal received (e.g., scan_mode) at a selection input of MUX 1015. In this fashion, a common clock path is provided for using either a first clock signal or a second clock signal in the method illustrated in FIGS. 12A and 12B, according to one or more embodiments.

Figure 13A:
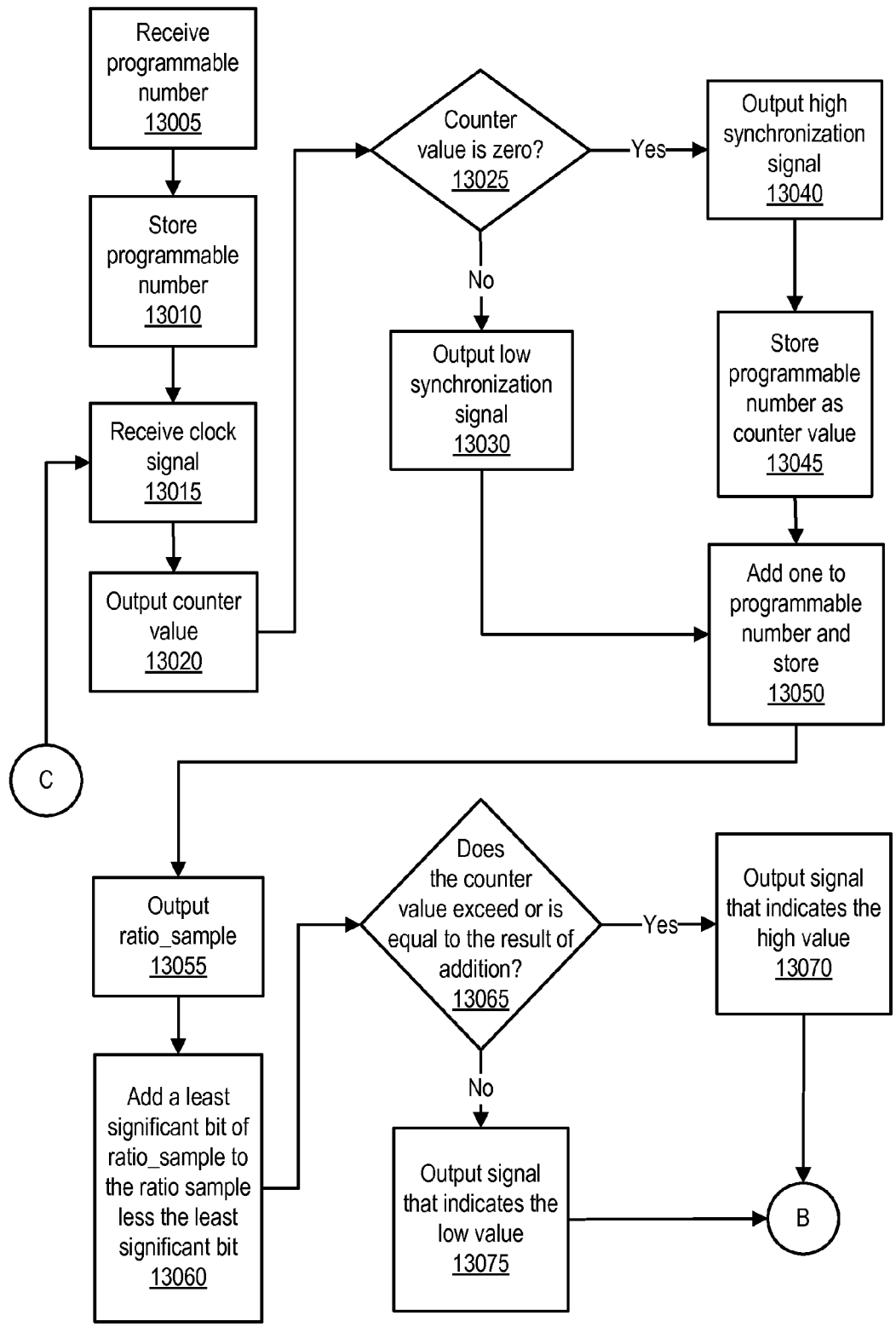
FIGS. 13A and 13B illustrate a method of operating a programmable clock divider, according to one or more embodiments.
Figure 13B:
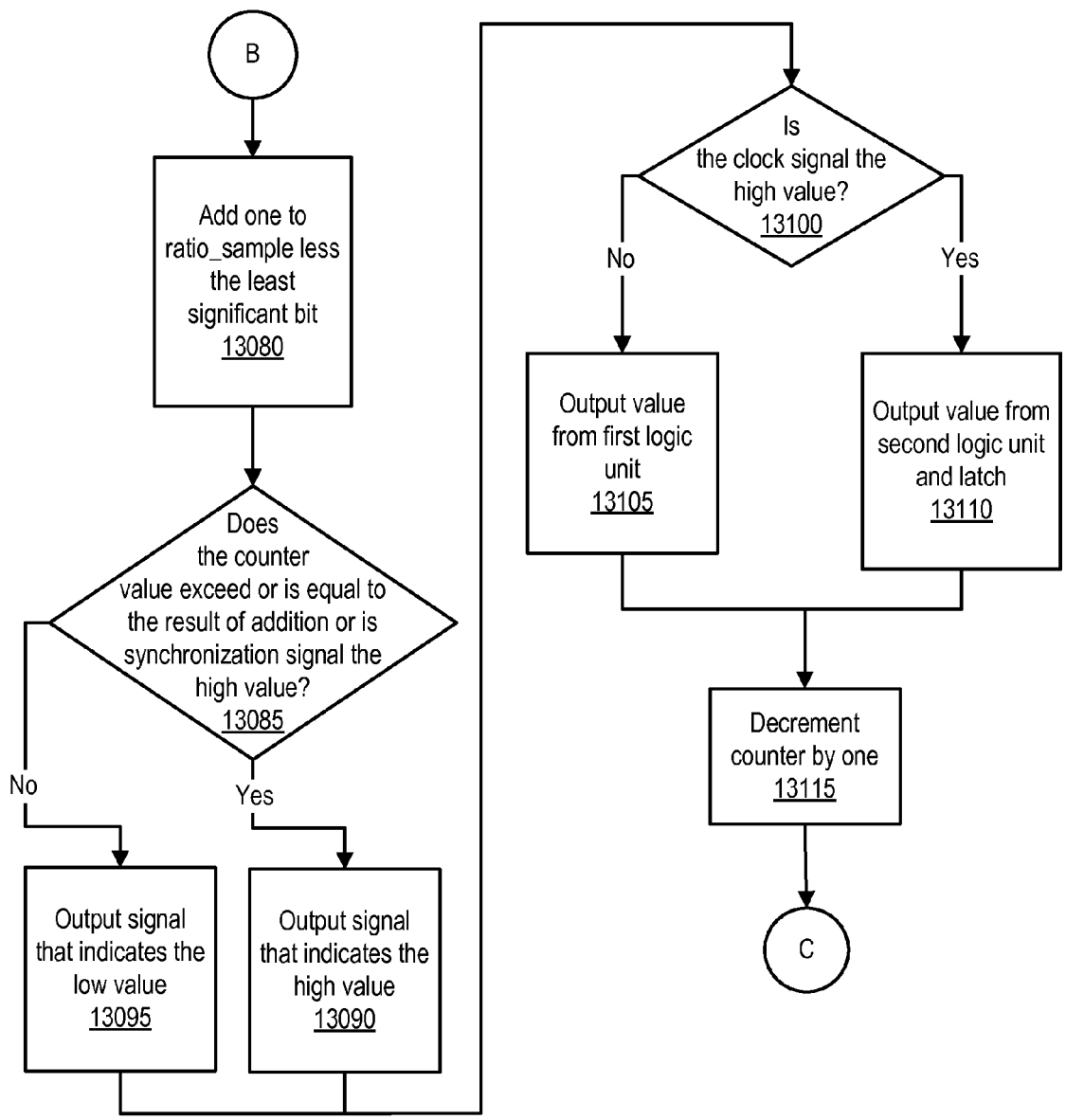

Turning now to FIGS. 13A and 13B, a diagram of a method of operating a programmable clock divider is illustrated, according to one or more embodiments. At 13005, a programmable number (freq_ratio) is received. At 13010, the programmable number is stored. For example, counter 1065 stores the programmable number. For instance, counter 1065 stores the programmable number when a synchronization signal (e.g., sync) is the high value. In one or more embodiments, counter 1065 stores the programmable number as a counter value of counter 1065. At 13015, a clock signal is received. At 13020, counter value of counter 1065 outputs the counter value of counter 1065. For example, counter 1065 outputs the counter value of counter 1065 to logic units 1040 and 1045. At 13025, it can be determined whether or not the counter value is zero. For example, comparator 1060 determines whether or not the counter value is zero and outputs the high value if the counter value is zero or outputs the low value if the counter is not zero. In one or more embodiments, MUX 1055 can output values from comparator 1060 when the sync_bypass signal is the high value.

If the counter value is zero, the low value can be output as the synchronization signal, at 13030. The method can proceed to 13050. If the counter value is not zero, the high value can be output as the synchronization signal, at 13040. At 13045, a second programmable number (freq_ratio) can be stored. For example, counter 1065 can store the second programmable as the counter value. In one or more embodiments, the programmable stored at 13010 can differ from the second programmable stored at 13045. In this fashion, a PCD (e.g., one of PCDs 1010-1014) can be re-programmed, and the rising edge of the divided clock signal from the re-programmed PCD can be synchronized to rising edges of divided clock signals of other PCDs and/or one or more clocks, or the PCD can continue using the same programmable number. At 13050, one can be added to the programmable number (freq_ratio). For example, logic unit 1031 adds one to the programmable number (freq_ratio) and stores the produced sum in a latch (e.g., latch 4020) when the synchronization signal is the high value. In one or more embodiments, when the synchronization signal is the low value, logic unit 1031 can provide the produced first sum via latch 4020. In one or more embodiments, the value from latch 4020 (e.g., ratio_sample) can be provided to logic units 1040 and 1045 at 13055.

At 13060, logic unit 1040 calculates a sum by adding the least significant bit from ratio_sample (e.g., ratio_sample[0]) to ratio_sample truncated by omitting the least significant bit of the ratio sample (e.g., ratio_sample[m:1], where ratio_sample include m bits for some non-zero integer m). In one example, logic unit 1040 can calculate the sum by adding ratio_sample divided by two using integer division and the remainder of the ratio_sample divided by two. In another example, logic unit 1040 can calculate the sum by adding the least significant bit of ratio_sample and ratio_sample bit-shifted down by one bit (e.g., towards its least significant bit).

At 13065, it can be determined whether or not the counter value exceeds or is equal to the sum produced by logic unit 1040. In one or more embodiments, adder 5010 and comparator 5020 can respectively perform 13060 and 13065 and can produce output based on an equation, such as counter_value>=ratio_sample[m:1]+ratio_sample[0]. If the counter value exceeds or is equal to the sum produced by adder 5010, the high value can be output, at 13070. In one example, the high value can be output as a signal to MUX 1020. The method can proceed to 13080. If the counter value does not exceed and is not equal to the sum produced by adder 5010, the low value can be output, at 13075. In one example, the low value can be output as a signal to MUX 1020.

At 13080, one can be added to ratio_sample truncated by omitting the least significant bit of the ratio sample (e.g., ratio_sample[m:1]). In one or more embodiments, logic unit 1045 can calculate a sum by adding can be added to ratio_sample truncated by omitting the least significant bit of ratio_sample. In one example, adder 6010 adds one to ratio_sample truncated by omitting the least significant bit of ratio_sample. In a second example, adder 6010 adds one to ratio_sample divided by two using integer division and disregarding any remainder. In another example, adder 6010 adds one to ratio_sample bit-shifted down by one bit (e.g., towards its least significant bit).

At 13085, it can be determined whether or not the counter value exceeds the sum produced by adder 6010 or whether or not the synchronization value represents the high value. In one or more embodiments, comparator 6020 and OR gate 6030 can perform 13085 and can produce output based on an equation, such as "(counter_value>=ratio_sample[m:1]+1) OR sync". If the synchronization signal is the high value or if the counter value is equal to or exceeds the sum produced by adder 6010, the high value can be output, at 13090. For example, the high value can be output as a signal to latch 1050. The method can proceed to 13100. If the synchronization signal is the low value and if the counter value is not equal to and does not exceed the sum produced by adder 6010, the low value can be output, at 13095. For example, the low value can be output as a signal to latch 1050.

At 13100, it can be determined whether or not the clock signal (clk_in) is the high value. If the clock signal is not the high value, the value from logic unit 1040 (e.g., a first logic unit) is output at 13105. The method can proceed to 13115. If the clock signal is the high value, the value from logic unit 1045 and latch 1050 (e.g., a second logic unit and a latch) is output at 13110. In one or more embodiments, MUX 1020 performs 13100, 13105, and 13110. At 13115, the value of counter 1065 can be decremented. In one or more embodiments, the method can proceed to 13015 to receive the input clock signal.

It is noted that, in one or more embodiments, one or more of the method elements described herein and/or one or more portions of an implementation of a method element may be performed in varying orders, may be performed concurrently with one or more of the other method elements and/or one or more portions of an implementation of a method element, or may be omitted. Additional method elements can be performed as desired. In one or more embodiments, concurrently can mean simultaneously. In one or more embodiments, concurrently can mean apparently simultaneously according to some metric. For example, two or more method elements and/or two or more portions of an implementation of a method element can be performed such that they appear to be simultaneous to a human. It is noted that, in one or more embodiments, one or more of the method elements described herein and/or one or more portions of an implementation of a method element can be implemented using logic implemented in hardware (e.g., one or more integrated circuits, one or more application specific circuits (ASICs), one or more field programmable gate arrays (FPGAs), etc.). In one example, one or more of the method elements described herein and/or one or more portions of an implementation of a method element can be implemented using one or more state machines implemented using logic implemented in hardware. It is also noted that, in one or more embodiments, one or more of the system elements described herein can be omitted and additional system elements can be added as desired.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A clock divider, comprising:
   a first circuit, including first logic to perform a first comparison of a first number and a count value to generate a first signal;
   a second circuit, including second logic to perform a second comparison of a second number and the count value to generate a second signal; and
   a first multiplexer including a first input coupled to the first circuit to receive the first signal, a second input coupled to the second circuit to receive the second signal, a selection input to receive a first clock signal, and an output, wherein the first multiplexer outputs an output signal via the output, as a divided clock signal, based on the first clock signal, the first signal, and the second signal, wherein the output signal transitions from a first value to a second value on at least one of a first edge of the first clock signal to output the first signal and a second edge of the first clock signal to output the second signal.

2. The clock divider of claim 1, further comprising:
   a second multiplexer including an output coupled to the selection input of the first multiplexer, a first input to receive a second clock signal, and a second input to receive a third clock signal, wherein the output of the second multiplexer provides at least one of the second clock signal and the third clock signal to the selection input of the first multiplexer as the first clock signal, wherein the first multiplexer and the second multiplexer provide a common path for the second clock signal and the third clock signal as an input clock to the clock divider.

3. The clock divider of claim 1, further comprising:
   a counter coupled to the first circuit to provide the count value.

4. The clock divider of claim 3,
   wherein the second circuit includes:
     a logic unit; and
     a latch coupled to the logic unit;
   wherein the logic unit compares the second number and the count value from the counter and provides the second signal to the latch; and
   wherein the latch provides the second signal to the first multiplexer.

5. The clock divider of claim 1, wherein if the first number is an even number, the output signal transitions from the first value to the second value on the first edge of the first clock signal, and if the first number is an odd number, the output signal transitions from the first value to the second value on the second edge of the first clock signal.

6. The clock divider of claim 1,
   wherein the first multiplexer receives, from the first circuit, the first value at the first input of the first multiplexer for each of a first set of sequential values corresponding to the second value of the first clock signal;
   wherein the first multiplexer receives, from the second circuit, the second value at the second input of the first multiplexer for each of a second set of sequential values corresponding to the first value of the first clock signal;
   wherein, if the first number is not equal to the second number, the first multiplexer receives:

the first value, from the second circuit, at the second input of the first multiplexer for each of a third set of sequential values corresponding to the first value of the first clock signal; and the second value, from the first circuit, at the first input of the first multiplexer for each of a fourth set of sequential values corresponding to the second value of the first clock signal; and wherein, if the first number is equal to the first number, the first multiplexer receives:

the first value, from the second circuit, at the second input of the first multiplexer for each of a fifth set of sequential values corresponding to the first value the first clock signal; and the second value, from the first circuit, at the first input of the first multiplexer for each of a sixth set of sequential values corresponding to the second value of the first clock signal.

7. The clock divider of claim 6, further comprising:
a second multiplexer including an output coupled to the selection input of the first multiplexer, a first input to receive a second clock signal, and a second input to receive a third clock signal, wherein the output of the second multiplexer provides at least one of the second clock signal and the third clock signal to the selection input of the first multiplexer as the first clock signal, wherein the first multiplexer and the second multiplexer provide a common path for the second clock signal and the third clock signal as input clock to the clock divider;
wherein the first multiplexer receives the third clock signal as the first clock signal;
wherein the first multiplexer receives, from the circuit, the first value at the first input of the first multiplexer for each of a seventh set of sequential values corresponding to the second value of the first clock signal;
wherein the first multiplexer receives, from the circuit, the second value at the second input of the first multiplexer for each of an eighth set of sequential values corresponding to the first value of the first clock signal;
wherein, if first number is not equal to the second number, the first multiplexer receives:

the first value, from the second circuit, at the second input of the first multiplexer for each of a ninth set of sequential values corresponding to the first value of the first clock signal; and the second value, from the circuit, at the first input of the first multiplexer for each of a tenth set of sequential values corresponding to the second value of the first clock signal; and wherein, if first number equals the second number, the first multiplexer receives:

the first value, from the second circuit, at the second input of the first multiplexer for each of an eleventh set of sequential values corresponding to the first value of the first clock signal; and the second value, from the circuit, at the first input of the first multiplexer for each of a twelfth set of sequential values corresponding to the second value of the first clock signal.

8. A method of operating a clock divider, comprising:
comparing a first number and a count value;
generating a first signal based on said comparing the first number and the count value;
comparing a second number and the count value;
generating a second signal based on said comparing the second number and the count value;

receiving the first signal at a first input of a first multiplexer;
receiving the second signal at a second input of the first multiplexer;
receiving a first clock signal at a selection input of the first multiplexer;
outputting, as output of the clock divider, an output signal via an output of the first multiplexer, wherein the output signal is based on the first clock signal, the first signal, and the second signal, wherein the output signal transitions from a first value to a second value on at least one of a first edge of the first clock signal to output the first signal and a second edge of the first clock signal to output the second signal.

9. The method of claim 8, further comprising:
receiving a second clock signal at a first input of a second multiplexer;
receiving a third clock signal at a second input of the second multiplexer
outputting at least one of the second clock signal and the third clock signal as the first clock signal via an output of the second multiplexer, wherein the output of the second multiplexer is coupled to the selection input of the first multiplexer.

10. The method of claim 9, wherein the first multiplexer and the second multiplexer provide a common path for the second clock signal and the third clock signal as input clock to the clock divider.

11. The method of claim 8, further comprising:
adjusting a counter based on the first clock signal; and
providing the count value based on said adjusting the counter.

12. The method of claim 11, wherein said adjusting the counter includes decrementing the count value.

13. The method of claim 8,
wherein said generating the first signal includes:
generating the first value for each of a first set of sequential values corresponding to the second value of the first clock signal;
if the first number is not equal to the second number, generating the second value for each of a second set of sequential values corresponding to the second value of the first clock signal; and
if the first number is equal to the first number, generating the second value for each of a third set of sequential values corresponding to the second value of the first clock signal; and
wherein said generating the second signal includes:
generating the second value for each of a fourth set of sequential values corresponding to the first value of the first clock signal;
if the first number is not equal to the second number, generating the first value for each of a fifth set of sequential values corresponding to the first value of the first clock signal; and
if the first number is equal to the first number, generating the first value for each of a sixth set of sequential values corresponding to the first value the first clock signal.

14. An integrated circuit, comprising:
a first circuit, including first logic to perform a first comparison of a first number and a count value to generate a first signal;
a second circuit, including second logic to perform a second comparison of a second number and the count value to generate a second signal; and
a first multiplexer including a first input coupled to the first circuit to receive the first signal, a second input coupled to the second circuit to receive the second signal, a selection input to receive a first clock signal, and an output, wherein the first multiplexer outputs an output signal via the output, as output of the clock divider, based on the first clock signal, the first signal, and the second signal, wherein the output signal transitions from a first value to a second value on at least one of a first edge of the first clock signal to output the first signal and a second edge of the first clock signal to output the second signal.

15. The integrated circuit of claim 1, further comprising:
a second multiplexer including an output coupled to the selection input of the first multiplexer, a first input to receive a second clock signal, and a second input to receive a third clock signal, wherein the output of the second multiplexer provides at least one of the second clock signal and the third clock signal to the selection input of the first multiplexer as the first clock signal, wherein the first multiplexer and the second multiplexer provide a common path for the second clock signal and the third clock signal as input clock to the clock divider.

16. The integrated circuit of claim 15, further comprising:
a counter coupled to the first circuit to provide the count value;
wherein the first circuit compares the first number and the count value and provides the first signal to the first multiplexer.

17. The integrated circuit of claim 16,
wherein the second circuit includes:
  a logic unit; and
  a latch coupled to the logic unit;
wherein the logic unit compares the second number and the count value from the counter and provides the second signal to the latch; and
wherein the latch provides the second signal to the first multiplexer.

18. The integrated circuit of claim 15, wherein if the first number is an even number, the output signal transitions from the first value to the second value on the first edge of the first clock signal, and if the first number is an odd number, the output signal transitions from the first value to the second value on the second edge of the first clock signal.

19. The integrated circuit of claim 15,
wherein the first multiplexer receives, from the first circuit, the first value at the first input of the first multiplexer for each of a first set of sequential values corresponding to the second value of the first clock signal;
wherein the first multiplexer receives, from the second circuit, the second value at the second input of the first multiplexer for each of a second set of sequential values corresponding to the first value of the first clock signal;
wherein, if the first number is not equal to the second number, the first multiplexer receives:
  the first value, from the second circuit, at the second input of the first multiplexer for each of a third set of sequential values corresponding to the first value of the first clock signal; and
  the second value, from the first circuit, at the first input of the first multiplexer for each of a fourth set of sequential values corresponding to the second value of the first clock signal; and
wherein, if the first number is equal to the second number, the first multiplexer receives:
  the first value, from the second circuit, at the second input of the first multiplexer for each of a fifth set of sequential values corresponding to the first value the first clock signal; and
  the second value, from the first circuit, at the first input of the first multiplexer for each of a sixth set of sequential values corresponding to the second value of the first clock signal.

20. The integrated circuit of claim 19, further comprising:
a second multiplexer including an output coupled to the selection input of the first multiplexer, a first input to receive a second clock signal, and a second input to receive a third clock signal, wherein the output of the second multiplexer provides at least one of the second clock signal and the third clock signal to the selection input of the first multiplexer as the first clock signal, wherein the first multiplexer and the second multiplexer provide a common path for the second clock signal and the third clock signal as input clock to the clock divider;
wherein the first multiplexer receives the third clock signal as the first clock signal;
wherein the first multiplexer receives, from the first circuit, the first value at the first input of the first multiplexer for each of a seventh set of sequential values corresponding to the second value of the first clock signal;
wherein the first multiplexer receives, from the second circuit, the second value at the second input of the first multiplexer for each of an eighth set of sequential values corresponding to the first value of the first clock signal;
wherein, if the first number is not equal to the second number, the first multiplexer receives:
  the first value, from the second circuit, at the second input of the first multiplexer for each of a ninth set of sequential values corresponding to the first value of the first clock signal; and
  the second value, from the first circuit, at the first input of the first multiplexer for each of a tenth set of sequential values corresponding to the second value of the first clock signal; and
wherein, if first number equals the second number, the first multiplexer receives:
  the first value, from the second circuit, at the second input of the first multiplexer for each of an eleventh set of sequential values corresponding to the first value of the first clock signal; and
  the second value, from the first circuit, at the first input of the first multiplexer for each of a twelfth set of sequential values corresponding to the second value of the first clock signal.

* * * * *

UNITED STATES PATENT AND TRADEMARK OFFICE
CERTIFICATE OF CORRECTION

| | |
|---|---|
| PATENT NO. | : 8,004,319 B2 |
| APPLICATION NO. | : 12/627276 |
| DATED | : August 23, 2011 |
| INVENTOR(S) | : Bhoodev Kumar et al. |

It is certified that error appears in the above-identified patent and that said Letters Patent is hereby corrected as shown below:

Col. 13, line 33, in Claim 7: insert --first-- between "the" and "circuit"
Col. 13, line 37, in Claim 7: insert --first-- between "the" and "circuit"
Col. 13, line 41, in Claim 7: insert --the-- between "if" and "first"
Col. 13, line 47, in Claim 7: insert --first-- between "the" and "circuit"
Col. 13, line 57, in Claim 7: insert --first-- between "the" and "circuit"
Col. 14, line 43, in Claim 13: delete "first" between "to the" and "number" and replace with --second--
Col. 14, line 55, in Claim 13: delete "first" between "to the" and "number" and replace with --second--
Col. 15, line 11, in Claim 15: replace "claim 1" with --claim 14--

Signed and Sealed this
Thirty-first Day of July, 2012

David J. Kappos
*Director of the United States Patent and Trademark Office*